(12) United States Patent
Kashima

(10) Patent No.: US 6,659,356 B2
(45) Date of Patent: Dec. 9, 2003

(54) HYBRID IC CARD

(75) Inventor: Masanori Kashima, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/145,654

(22) Filed: May 14, 2002

(65) Prior Publication Data

US 2002/0170974 A1 Nov. 21, 2002

(30) Foreign Application Priority Data

May 16, 2001 (JP) ........................................ 2001-146933

(51) Int. Cl.[7] .............................................. G06K 19/06
(52) U.S. Cl. ........................ 235/492; 235/487; 235/486
(58) Field of Search ................................. 235/492, 487, 235/486; 700/9; 343/895, 700 MS

(56) References Cited

U.S. PATENT DOCUMENTS

| | | | |
|---|---|---|---|
| 4,942,534 A | * 7/1990 | Yokoyama et al. ............ 700/9 |
| 5,612,532 A | * 3/1997 | Iwasaki ....................... 235/492 |
| 5,686,714 A | * 11/1997 | Abe et al. .................... 235/435 |
| 5,710,421 A | * 1/1998 | Kokubu ....................... 235/492 |
| 5,712,472 A | * 1/1998 | Lee ............................. 235/486 |
| 6,356,517 B1 | * 3/2002 | Liu et al. ..................... 369/14 |
| 6,378,774 B1 | * 4/2002 | Emori et al. ................. 235/492 |
| 6,422,473 B1 | * 7/2002 | Ikefuji et al. ................ 235/492 |
| 6,460,773 B1 | * 10/2002 | Kaiya et al. ................. 235/492 |
| 6,478,228 B1 | * 11/2002 | Ikefuji et al. ................ 235/492 |

FOREIGN PATENT DOCUMENTS

| | | | | |
|---|---|---|---|---|
| EP | 1 031 939 | | 8/2000 | |
| JP | 02268390 A | * | 11/1990 | ......... G06K/17/00 |
| JP | 11-149537 | | 6/1999 | |

* cited by examiner

Primary Examiner—Michael G. Lee
Assistant Examiner—Kumiko C. Koyama
(74) Attorney, Agent, or Firm—Merchant & Gould P.C.

(57) ABSTRACT

A hybrid IC card has an IC card and a housing. The IC card has a card member and an integrated circuit device fixed in a recess of the card member, and the integrated circuit device includes on one surface an antenna terminal and an external connection terminal while the opposite surface includes an integrated circuit element functioning as a contact type card and a noncontact type card, in which the antenna terminal and the external connection terminal are connected with the integrated circuit element. The housing includes an antenna and an antenna contact is connected to the antenna, to which the IC card is attached removably, wherein in a state that the IC card is attached to the housing, the antenna terminal of the IC card is in contact with the antenna contact of the housing so that they are connected electrically, and the IC card functions as a noncontact type IC card.

4 Claims, 10 Drawing Sheets

HYBRID IC CARD

FIELD OF THE INVENTION

The present invention relates to a hybrid IC card having functions both of a contact type IC card, which is supplied with operation power and sends/receives signals via an external terminal, and of a noncontact type IC card, which is supplied with operation power electromagnetically and sends/receives signals without using any external contacts.

BACKGROUND OF THE INVENTION

Recently, commercialization of hybrid IC cards has been advanced. Such a hybrid IC card is configured by mounting on a plastic card any integrated circuit elements such as microcomputers and memories, and has both functions of a contact type IC card, which sends/receives signals to/from external equipment via an external connection terminal, and a noncontact type IC card, which sends/receives signals to/from external equipment via an antenna. It is intended to use the hybrid IC card as a contact type card when emphasis is placed on security while using as a noncontact type card when emphasis is placed on a quick proceeding. Security is required, for example, when the hybrid IC card is used for payment or for recording a large volume of personal data. A quick proceeding is required, for example, when the card is used as a commutation ticket or when it is used as a prepaid card for shopping at convenience stores.

A conventional hybrid IC card having functions of a contact type card and of a noncontact type card is configured as shown in FIGS. 17–19. FIG. 17 is a plan view showing a hybrid IC card 1, FIG. 18 is the side view, and FIG. 19 is an enlarged cross-sectional view showing essential portions of the hybrid IC card.

A hybrid IC card shown in FIG. 17 is configured by embedding an integrated circuit device 10 in a card member 12, and providing an antenna 13 to be connected with the integrated circuit device 10.

As shown in FIG. 18, the card member 12 is made of two layers, i.e., a first layer card member 12a and a second layer card member 12b. The antenna 13 is located and fixed between the first layer card member 12a and the second layer card member 12b. For connecting the antenna 13 with the integrated circuit device 10, as shown in FIGS. 17 and 19, a crossed portion 13b is formed in the vicinity of an end portion 13a of the antenna 13. Measures are taken for preventing insulation failure at the crossed portion 13b, for example, forming an insulator layer 14, or embedding one end of the antenna 13 in the second layer card member 12b.

As shown in FIG. 19, the integrated circuit device 10 is prepared by mounting on a glass epoxy laminated wiring board with double-sided copper-cladding (hereinafter, abbreviated as a wiring board) 2 an integrated circuit element 6 having functions of a contact type card and of a noncontact type card. An external connection terminal 4 is provided to one surface of the wiring board 2, while an antenna connection land 5 is formed on the opposite surface. A through-hole 3a is formed through an insulator substrate 3 composing the wiring board 2 at a part corresponding to the external connection terminal 4, and the integrated circuit element 6 is bonded and fixed with a die bond resin 7 at a predetermined position. To the integrated circuit element 6, an I/O electrode 6a required for providing a function of a contact type card and an I/O electrode 6b required for providing a function of a noncontact type card are formed. The I/O electrode 6a and the external connection terminal 4 are connected electrically with each other with a gold wire 8 by a so-called wire-bonding method via the through-hole 3a. A bonding land 5a formed on an extended portion of the antenna connection land 5 and the I/O electrode 6b are connected electrically with each other by the wire-bonding method. The integrated circuit element 6 and the gold wire 8 are covered with a sealing resin 9.

For embedding the integrated circuit device 10 in the card member 12, a recess 12c is formed by milling so as to expose the end portion 13a of the antenna 13. Next, the integrated circuit device 10 is bonded and fixed to the recess 12c with an adhesive 15. Then, the end portion 13a of the antenna 13 is applied with a conductive adhesive 16, and the antenna connection land 5 and the antenna 13 are connected electrically. Thus, a hybrid IC card 1 is produced.

However, such a conventional hybrid IC card will be expensive since it comprises a glass epoxy laminated wiring board with double-sided copper-cladding. Moreover, preparation of card members for sandwiching an antenna requires also a complicated and precise process, resulting in a complicated manufacturing method. In view of the reliability, a card comprising an antenna has a poor durability to physical stresses such as bending and torsion, and thus, such a card is inferior to a conventional contact type IC card.

Moreover, because an antenna should be sandwiched between card members for a conventional hybrid IC card, embossing available for a conventional contact type IC card is extremely restricted, and formation of a magnetic stripe is hindered considerably. Namely, some functions that can be available for conventional contact type IC cards will be extremely difficult to obtain.

SUMMARY OF THE INVENTION

It is an object of the present invention to solve the problems of conventional hybrid IC cards and provide a reliable and cost-effective hybrid IC card that is suitable for mass production.

For achieving the above-mentioned purpose, a hybrid IC card of the present invention comprises an IC card made of a card member having a recess for fixing an integrated circuit device having on one surface an antenna terminal and an external connection terminal while on the opposite surface an integrated circuit element having functions of a contact type card and of a noncontact type card is provided, in which the antenna terminal and the external connection terminal are connected to the integrated circuit element, and the hybrid IC card comprises also a housing comprising an antenna and an antenna contact connected to the antenna and to which the IC card can be attached removably. In a state in which the IC card is attached to the housing, the antenna terminal of the IC card and the antenna contact of the housing are contacted electrically with each other for electrical connection, and thus the IC card functions as a noncontact type card.

This structure allows use of a glass epoxy laminated wiring board with single-sided copper-cladding. Moreover, since there is no need of interposing an antenna between the card members, the IC card can be produced in a method of producing a conventional contact type IC card. Since the IC card has no antennas, it will have excellent physical properties just like a conventional hybrid IC card with respect to bending, torsion or the like. Moreover, since there is no need of sandwiching an antenna between card members, the card can be embossed or formed with a magnetic stripe similar to a conventional contact type IC card. Furthermore, since the housing including the antenna serves as a card case, the IC card can be attached to the housing for portability in order to relieve excessive stress applied accidentally, and the thus obtained hybrid IC card will have high reliability.

An IC card according to the present invention composes the above-described hybrid IC card, and comprises a card member having a recess for fixing an integrated circuit device having on one surface an antenna terminal and an external connection terminal while on the opposite surface an integrated circuit element to provide functions of a contact type card and of a noncontact type card is located, wherein the antenna terminal and the external connection terminal are connected to the integrated circuit element.

It is preferable for the IC card that the antenna terminal is located between a group of terminals C1, C2, C3, C4 and a group of terminals C5, C6, C7, C8 defined in ISO-7816. Alternatively, it is preferable that the antenna terminal is located at a position of RFU (Reversed For Future Use) terminal defined in ISO-7816.

Accordingly, the integrated circuit device of the present invention can be produced to have a dimension of an integrated circuit device mounted on a conventional contact type IC card. Therefore, the hybrid IC card can be produced in a facility for producing conventional cards, reducing the production cost.

A housing for the hybrid IC card of the present invention composes the above-described hybrid IC card. It is provided with an antenna and an antenna contact connected with the antenna, and it is configured to allow removable attachment thereto of an IC card.

It is preferable that the housing has a contact for electrical connection with the external connection terminal of the IC card, and the housing is portable. A hybrid IC card configured as described above has reading/writing functions of a contact type IC card, and it enables for a holder of the card to use the functions for confirmation of data recorded on the hybrid IC card, writing of the data, and the like. As a result, a versatile hybrid card can be provided.

DETAILED DESCRIPTION OF THE INVENTION

Preferred embodiments of the present invention are described below, referring to FIGS. 1–16.

(First Embodiment)

Figure 1:
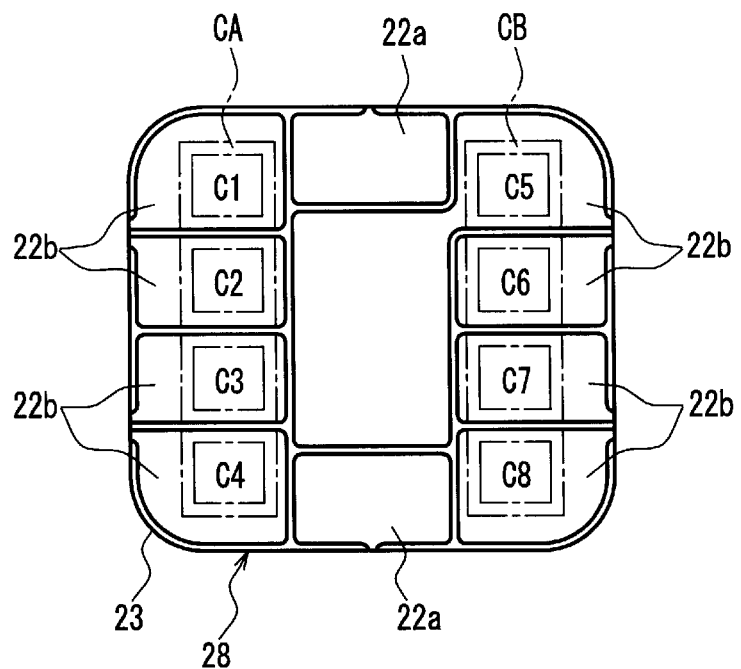
FIG. 1 is a plan view showing a glass epoxy laminated wiring board with single-sided copper-cladding in a first embodiment of the present invention.
Figure 2:
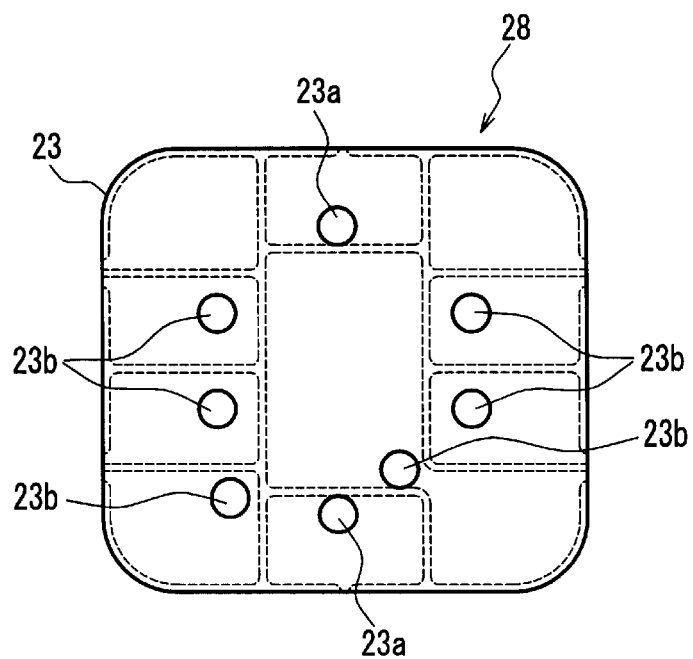
FIG. 2 is a backside view showing the wiring board of FIG. 1.
Figure 3:
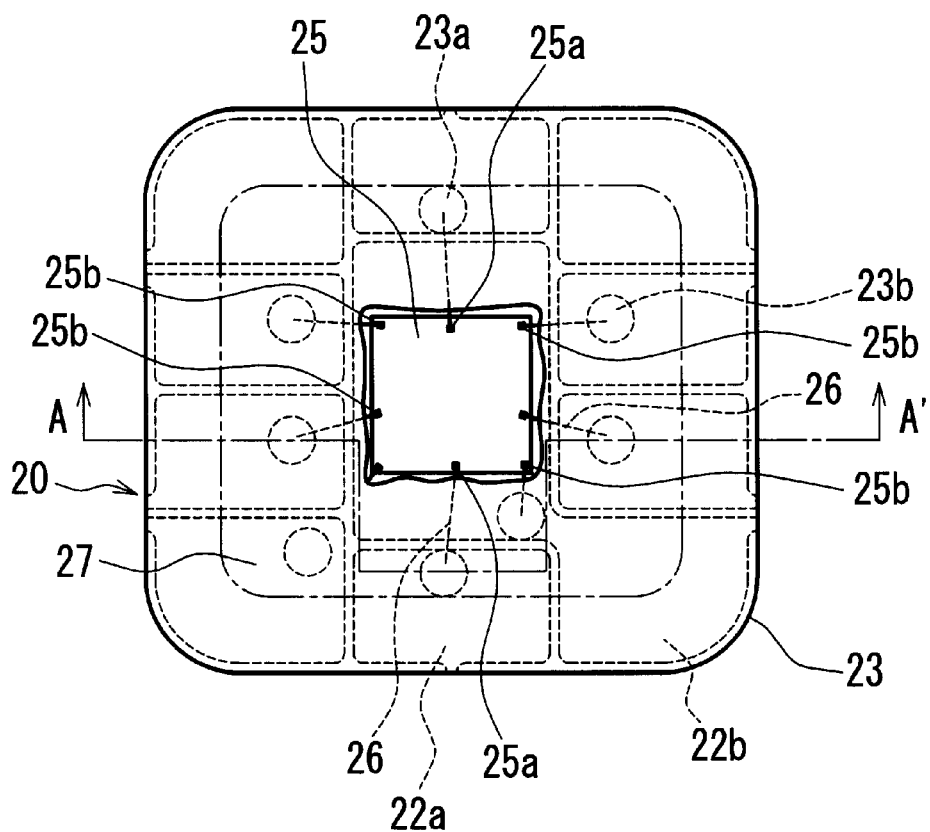
FIG. 3 is a plan view showing an integrated circuit device in the first embodiment of the present invention.
Figure 4:
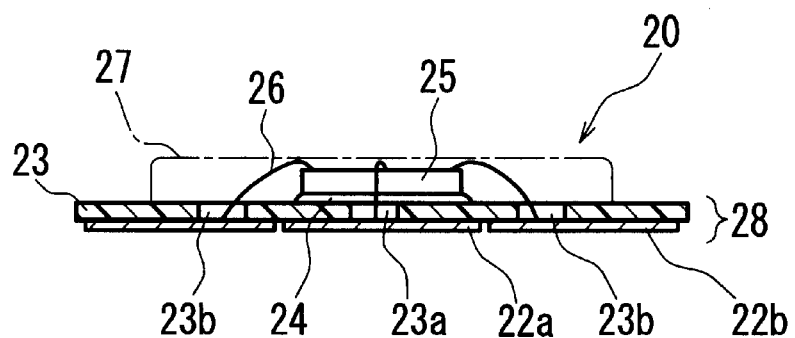
FIG. 4 is a cross-sectional view of the integrated circuit device of FIG. 3 taken along line A–A'.
Figure 5:
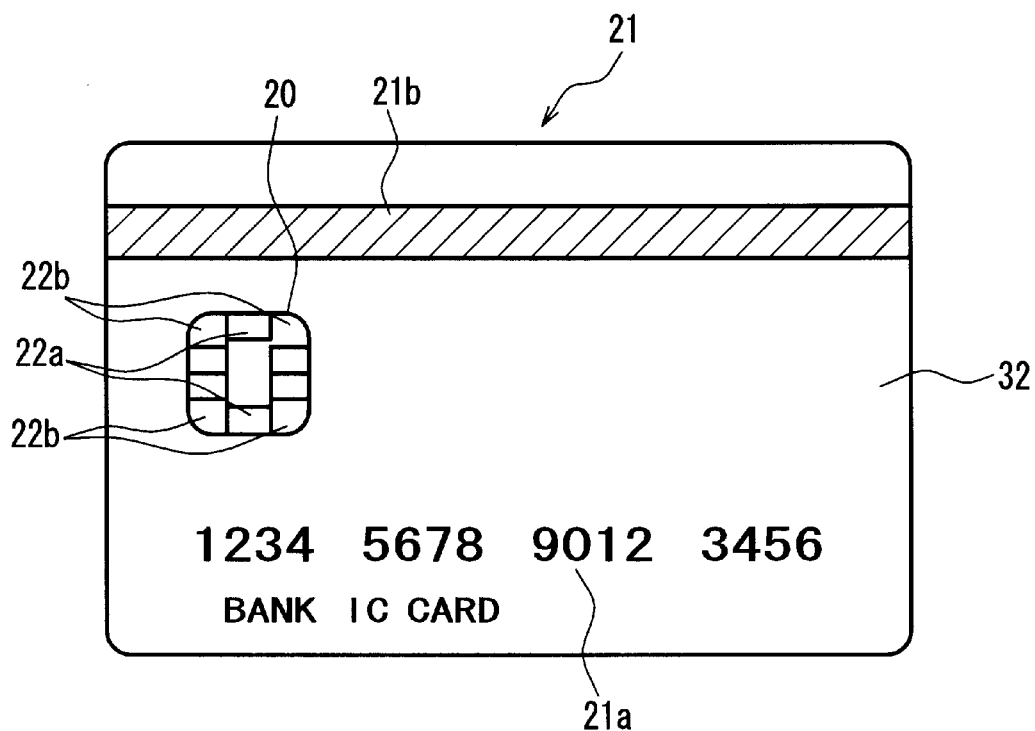
FIG. 5 is a plan view of a hybrid IC card in the first embodiment of the present invention.
Figure 6:
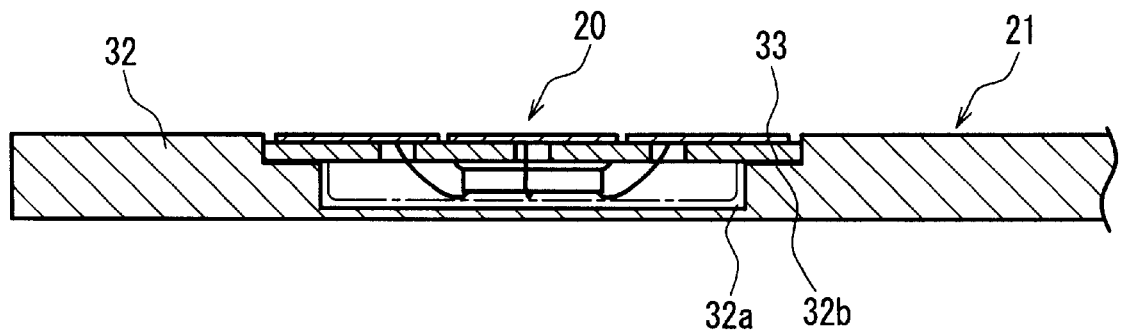
FIG. 6 is an enlarged cross-sectional view showing essential components of the hybrid IC card of FIG. 5.
Figure 7:
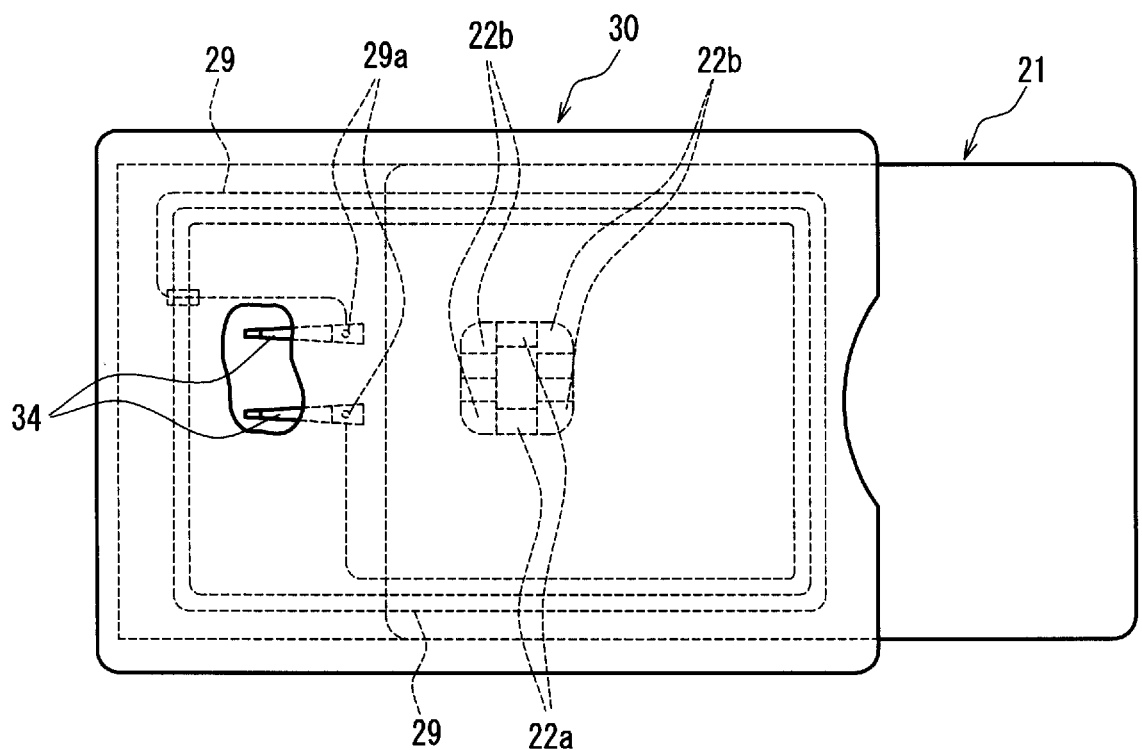
FIG. 7 is a plan view showing the hybrid IC card in the course of attaching the hybrid IC card to a housing.
Figure 8:
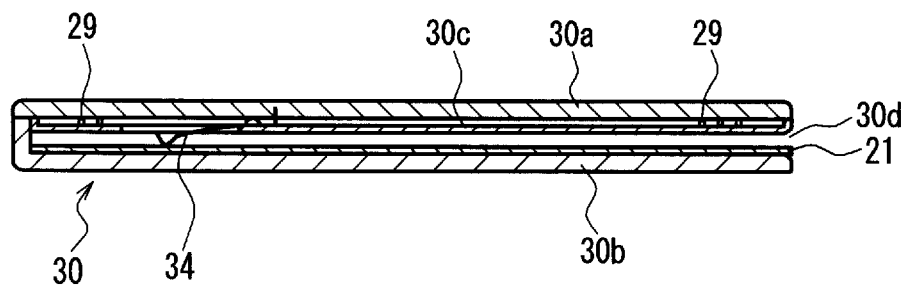
FIG. 8 is a cross-sectional view showing the hybrid IC card of FIG. 5 attached to a housing.

A hybrid IC card in a first embodiment is described below referring to FIGS. 1–8. FIG. 1 is a plan view of a glass epoxy laminated wiring board 28 with single-sided copper-cladding (hereinafter, abbreviated as a wiring board) observed from its surface, and FIG. 2 is a backside view of the wiring board 28. FIG. 3 is a plan view showing an integrated circuit device 20 using the wiring board 28, and FIG. 4 is the cross sectional view. FIG. 5 is a plan view showing an IC card 21 using the integrated circuit device 20, and FIG. 6 is the cross-sectional view. FIG. 7 is a plan view showing the IC card 21 attached to a housing 30, and FIG. 8 is the cross-sectional view.

As shown in FIGS. 1 and 2, the wiring board 28 has an insulator substrate 23. On one surface of the insulator substrate 23, antenna terminals 22a for providing a function of a noncontact type IC card and also external connection terminals 22b for providing a function of a contact type IC card are located. The external connection terminals 22b comprise a group CA made up of terminals C1, C2, C3, C4 and a group CB made up of terminals C5, C6, C7, C8, both defined in ISO-7816. The antenna terminals 22a are located between the group CA and the group CB. The insulator substrate 23 is provided with through-holes 23a, 23b at portions corresponding to the antenna terminals 22a and the external connection terminals 22b.

The integrated circuit device 20 shown in FIGS. 3 and 4 is formed by mounting an integrated circuit element 25 on the above-described wiring board 28. The integrated circuit element 25 is provided with antenna I/O electrodes 25a for providing a function of a noncontact type IC card and I/O electrodes 25b for providing a function of a contact type IC card. Numeral 26 denotes a wire, e.g. of gold, used as a connecting means. This connects electrically the antenna I/O electrodes 25a to the antenna terminals 22a via the first through-holes 23a, while connecting the I/O electrodes 25b to the external connection terminals 22b via the second through-holes 23b. The integrated circuit element 25 and the gold wire 26 are covered with a sealing resin 27. The sealing resin 27 is drawn by an alternate long and short dash line so as to make easy the visual understanding of the other parts.

In the IC card 21 shown in FIGS. 5 and 6, 32 denotes a card member in which a recess 32a is formed. The above-described integrated circuit device 20 is embedded in the recess 32a. On the card member 32, an embossing 21a and a magnetic stripe 21b are provided just like a bank card, a credit card or the like.

As shown in FIGS. 7 and 8, the IC card 21 is inserted into the housing 30 according to a purpose of an application. The housing 30 comprises a coil-shaped antenna 29 and antenna contacts 34. The antenna contacts 34 are members used for connecting electrically the antenna terminals 22a of the IC card 21 and the antenna 29. Due to the connection, the IC card 21 can function as a noncontact type card. As shown in FIG. 8, the housing 30 is composed of an upper member 30a, a lower member 30b and an intermediate member 30c, and the antenna 29 is interposed between the upper member 30a and the intermediate member 30c. End portions 29a of the antenna 29 are connected electrically with the antenna contacts 34. The antenna contacts 34 are fixed to the upper member 30a. Numeral 30d denotes an opening formed on the housing 30 for inserting the IC card 21.

The IC card 21 and the housing 30 configured as mentioned above will be described in detail referring to methods of producing the same.

The wiring board 28 shown in FIG. 1 or 2 has a thickness of about 0.14 mm. Such a wiring board 28 may be produced by a technique as described in JP-A-63281896 that discloses a printed wiring board for an IC card. The insulator substrate 23 is prepared by cladding a copper foil having a thickness of 0.035 mm on one surface of a glass epoxy substrate having a thickness of 0.1 mm. An exposed part is plated with Ni in a thickness range from 1 $\mu$m to 3 $\mu$m, and further plated with Au in a thickness range from 0.3 $\mu$m to 0.5 $\mu$m.

Next, as shown in FIGS. 3 and 4, for formation of an integrated circuit device 20, an integrated circuit element 25 is bonded and fixed with a die-bond resin 24 in a well-known die-bonding method on the insulator substrate 23. Next, the I/O electrodes 25b of the integrated circuit element 25 and the external connection terminals 22b are connected electrically with each other with a gold wire 26 via the first through-holes 23b in a well-known wire-bonding method. Further, the antenna I/O electrodes 25a of the integrated circuit element 25 and the antenna terminals 22a are connected electrically with each other via the second through-holes 23a. The gold wire used here has a diameter of 25 $\mu$m.

Next, the integrated circuit element 25 and the gold wire 26 are covered with the sealing resin 27 by a resin-sealing method as disclosed in JP-2661196, e.g., a transfer-molding method, so as to form an integrated circuit device 20, though this process is not shown in the drawings of the specification. Although the wiring board 28 supports one integrated circuit device 20 in the above description, a plurality of the integrated circuit devices can be mounted easily in a form of a continuous tape (not shown) for a large-scale production.

Next, as shown in FIGS. 5 and 6, for assembling as an IC card 21, a card member 32 of about 0.76 mm thickness based on either a vinyl chloride resin or an ABS resin is prepared. The card member 32 has a recess 32a with a flat portion 32b, to which a periphery of the circuit substrate 28 of the integrated circuit device 20 is bonded and fixed using a fast action adhesive (e.g., a cyanoacrylate adhesive) or a thermal activation type double-sided adhesive film 33. For the card member 32 that can be provided with an emboss 21a and a magnetic stripe 21b as shown in FIG. 5, PET resins or the like have been proposed recently, though any materials including such resins are inferior to vinyl chloride resins at the present time.

The housing 30 shown in FIGS. 7 and 8 is produced using a plastic resin such as an ABS resin. The antenna 29 is assembled, for example, by sandwiching a copper wire of a diameter of 0.2 mm between two PET films (not shown) having a thickness of about 0.1 mm. The antenna 29 can be produced by various methods such as, use of a flexible pattern film (FPC) prepared by forming an antenna pattern with a copper foil on a polyimide film, or use of a printed wiring board of a glass epoxy material. The antenna contacts 34 can be prepared, for example, by plating gold on an elastic material such as phosphor bronze for spring. The end portions 29a of the antenna 29 are connected electrically with the antenna contacts 34 by soldering or the like.

By inserting the IC card 21 from the opening 30d of the housing 30, the antenna contacts 34 comes in contact with the antenna terminals 22a of the IC card 21 and they are connected electrically with each other. Thus the IC card 21 sends and receives signals from a noncontact type external apparatus via the antenna 29 of the housing 30, providing a function of a noncontact type IC card. For a use as a contact type card, the IC card 21 is taken out from the housing 30 and loaded into a contact type IC card read-write device (not shown) so that it functions via the external connection terminals 22b.

(Second Embodiment)

Figure 9:
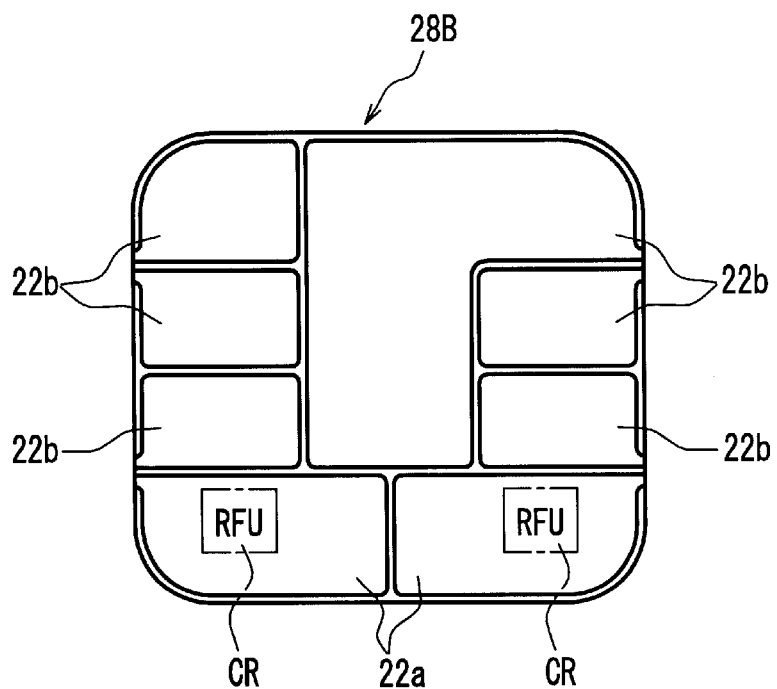
FIG. 9 is a plan view showing a wiring board in a second embodiment of the present invention.
Figure 10:
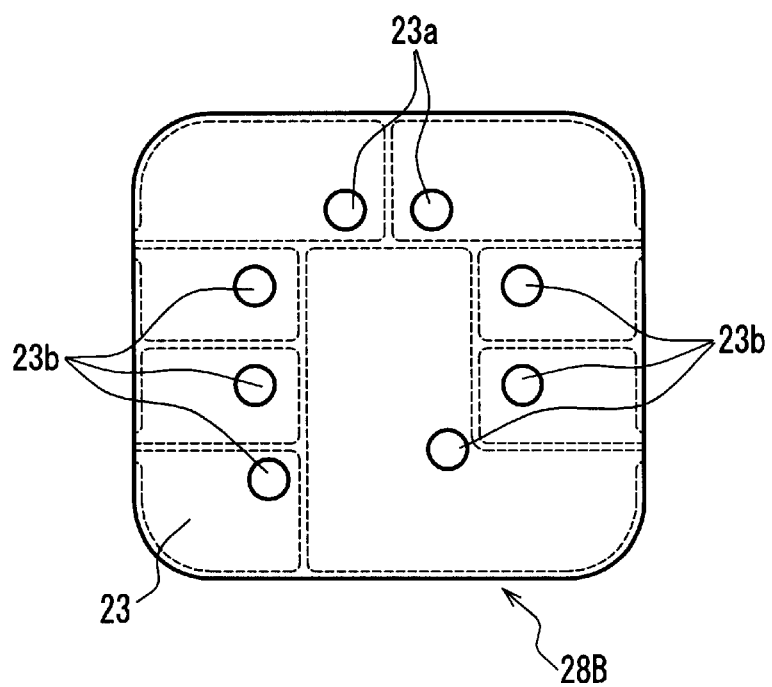
FIG. 10 is a backside view of the wiring board of FIG. 9.
Figure 11:
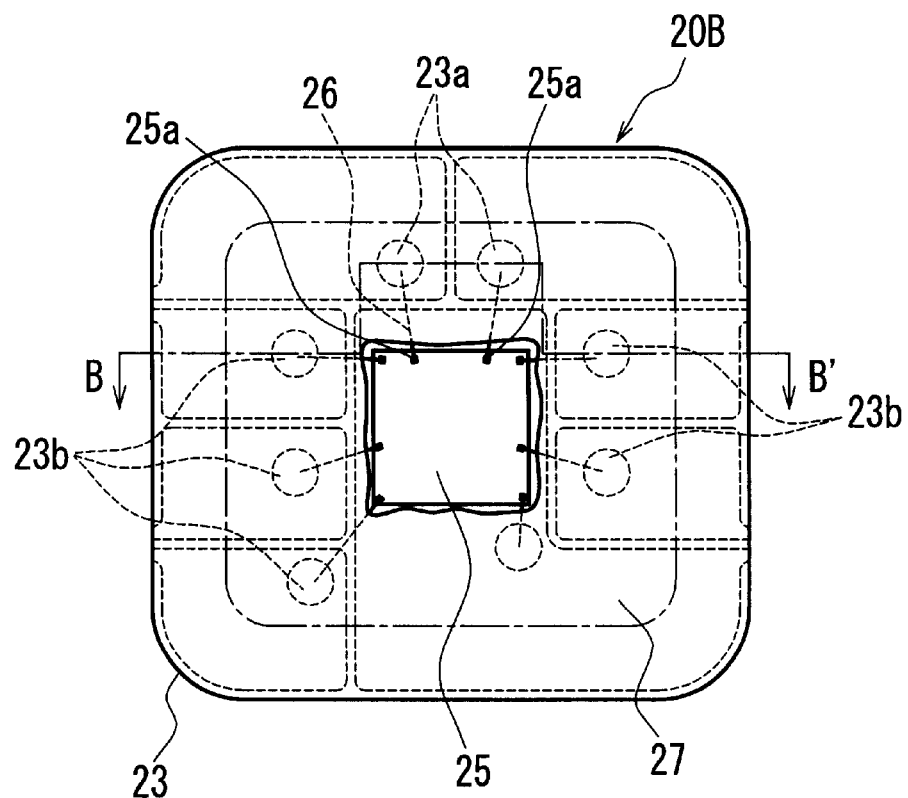
FIG. 11 is a plan view showing an integrated circuit device in the second embodiment of the present invention.
Figure 12:
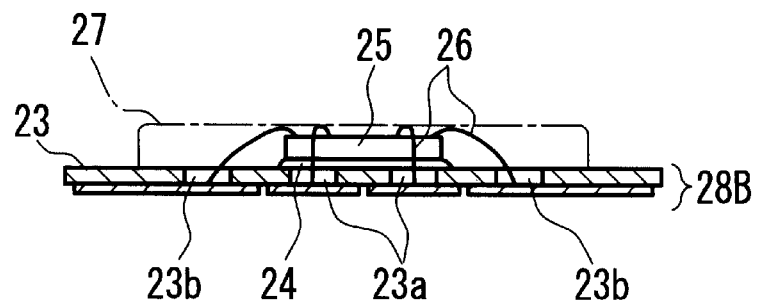
FIG. 12 is a cross-sectional view of the integrated circuit device of FIG. 11 taken along a line B–B'.
Figure 13:
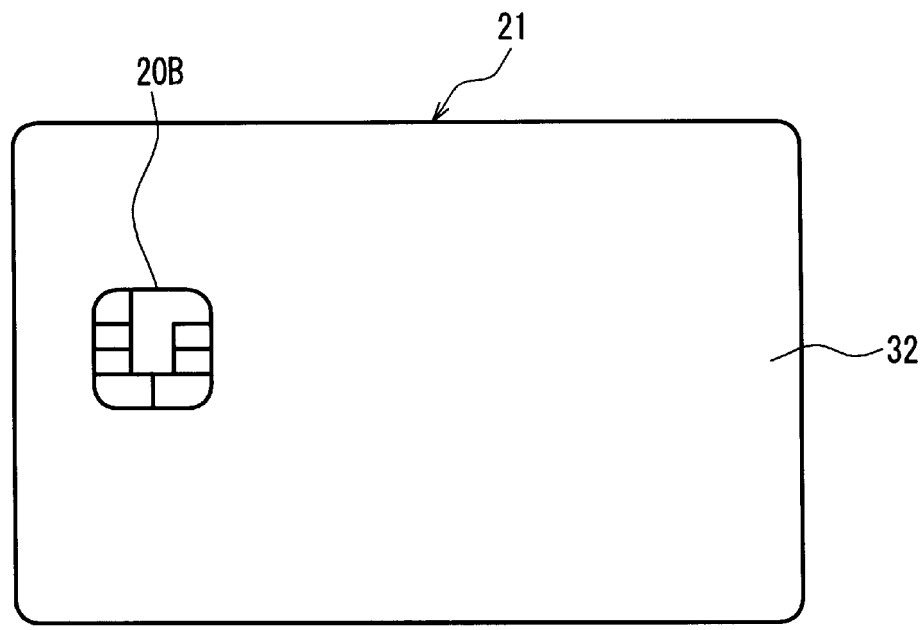
FIG. 13 is a plan view showing a hybrid IC card in the second embodiment of the present invention.
Figure 14:
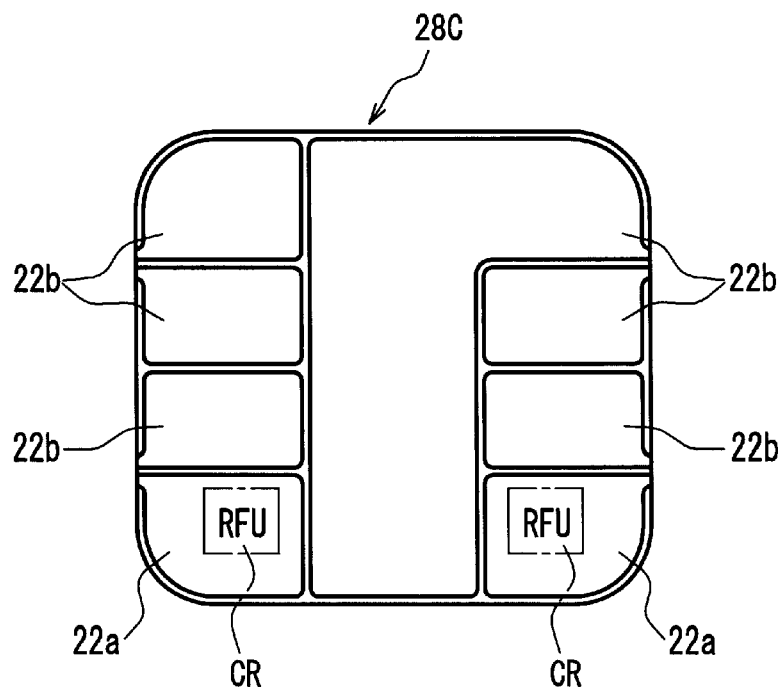
FIG. 14 a plan view showing another example of an antenna terminal in the second embodiment of the present invention.
Figure 15:
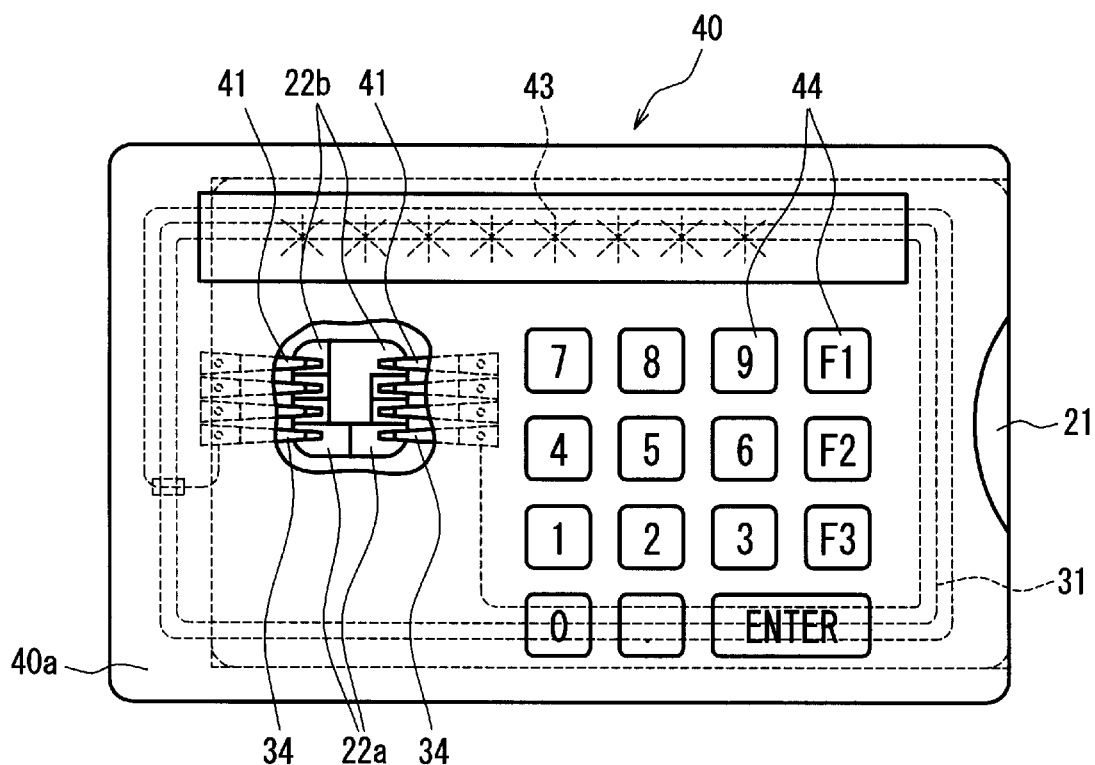
FIG. 15 is a plan view showing the hybrid IC card of FIG. 13 attached to a housing.

A hybrid IC card in a second embodiment is described below referring to FIGS. 9–16. FIG. 9 is a plan view showing a wiring board 28B observed from its surface, and FIG. 10 is the backside view. FIG. 11 is a plan view showing an integrated circuit device 20B using the wiring board 28B, and FIG. 12 is the cross-sectional view thereof FIG. 13 is a plan view showing an IC card 21 using the integrated circuit device 20B. FIG. 15 is a plan view showing the IC card 21 attached to a housing 40, and FIG. 16 is the cross-sectional view thereof.

Since the IC card 21 has a basic structure similar to that of the first embodiment, explanation of similar components provided with identical reference numbers will not be repeated. This IC card is different from that of the first embodiment in that the antenna terminals 22a are located at CR positions of RFU (Reserved For Future Use) terminals defined in ISO-7816 on the wiring board 28B shown in FIG. 9. The antenna terminals 22a of the wiring board 28B shown in FIG. 9 can be formed as those of a wiring board 28C shown in FIG. 14.

The structures shown in FIGS. 10–13 are also identical to those of the first embodiment except that the antenna terminals 22a are located corresponding to FIG. 9.

Figure 16:
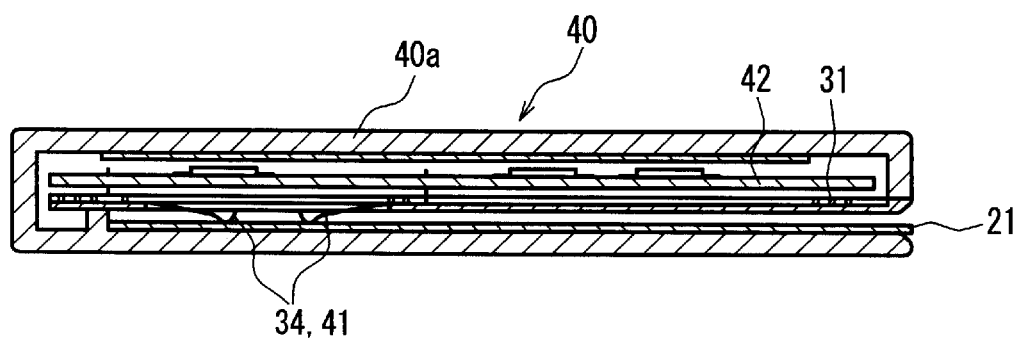
FIG. 16 is a cross-sectional view showing the hybrid IC card of FIG. 13 attached to a housing.
Figure 17:
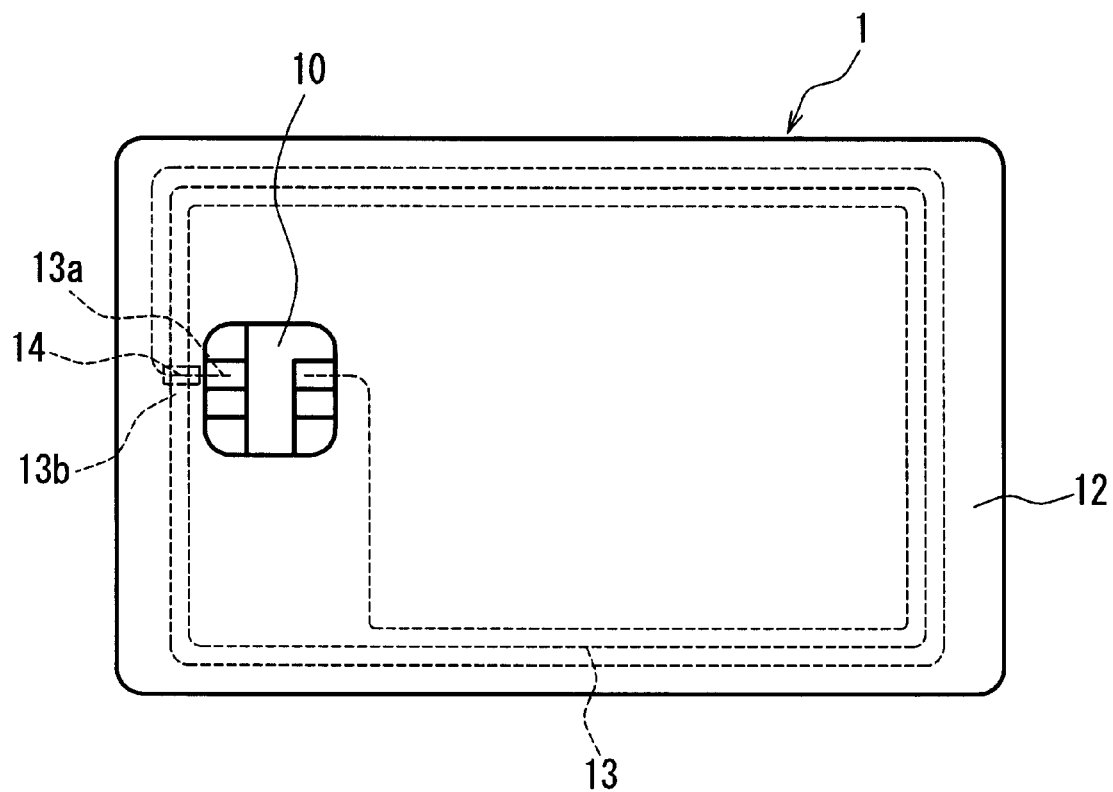
FIG. 17 is a plan view showing a conventional hybrid IC card.
Figure 18:
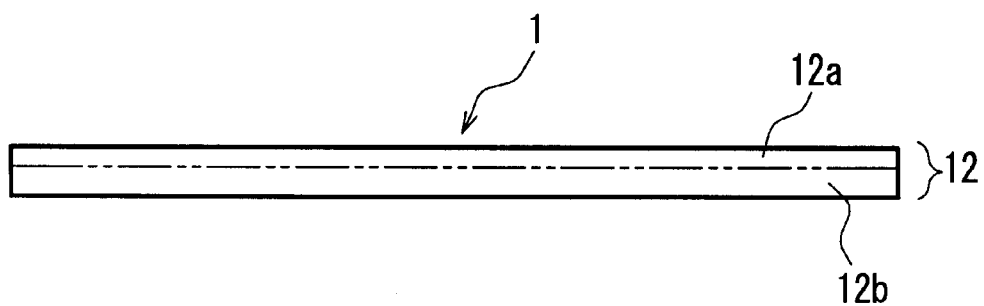
FIG. 18 is a side view showing the hybrid IC card of FIG. 17.
Figure 19:
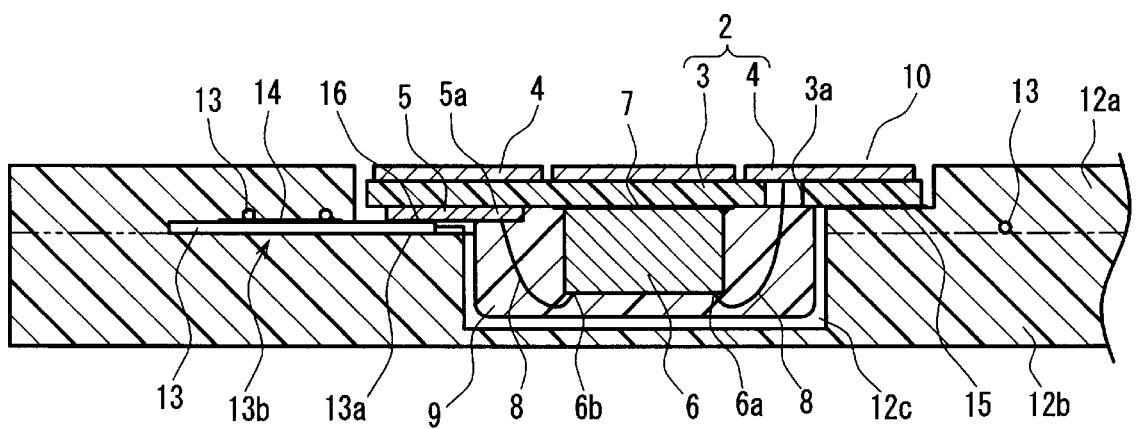
FIG. 19 is an enlarged cross-sectional view showing essential components of a conventional hybrid IC card.

As shown in FIGS. 15 and 16, a housing 40 has functions of a contact type card reading/writing device. For this purpose, the housing 40 comprises the following components as well as an antenna 31 and antenna contacts 34. Specifically, a printed wiring board 42 is provided inside the housing 40. The printed wiring board 42 is provided with contacts 41 for an electrical connection with external connection terminals 22b of an IC card 21, and other electric components such as microcomputers. An upper member 40a of the housing 40 is provided with a liquid crystal display 43 for displaying data recorded on the IC card 21 and for displaying operation procedures, and also key switches 44 for inputting passwords to function the IC card 21 as a contact type card and for restricting the functions and so on (not shown in FIG. 10). They are connected to the electric components on the printed wiring board.

Functions of a noncontact type card and of a contact type card can be achieved by attaching the IC card 21 to a housing 40 having functions of a contact type IC card reading/writing device.

As mentioned above, a hybrid IC card according to the present invention can comprise a glass epoxy laminated wiring board with single-sided copper-cladding and the card member requires no antennas, and thus it can be produced in a method of producing a conventional contact type IC card. In a view of the reliability, the IC card comprising no antennas has excellent physical properties against bending and torsion similar to a conventional contact type IC card.

Moreover, since there is no need for interposing an antenna in card members, the hybrid IC card of the present invention can be embossed or provided with a magnetic stripe similar to a conventional contact type IC card.

Furthermore, since the housing comprising an antenna functions as a card case, an IC card can be attached to the housing for portability so that excessive stress applied accidentally can be relieved, providing a hybrid IC card with a high reliability.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, all changes that come within the meaning and range of equivalency of the claims are intended to be embraced therein.

What is claimed is:

1. A hybrid IC card comprising:

an IC card having a card member and an integrated circuit device fixed in a recess of the card member, the integrated circuit device being provided on one surface with an antenna terminal and an external connection terminal while on the opposite surface an integrated circuit element functioning as a contact card and a noncontact card is provided, in which the antenna terminal and the external connection terminal are connected with the integrated circuit element, and a housing provided with a coil-shaped antenna, an opening to which the IC card is capable of being inserted removably, and an antenna contact connected directly to the end of the antenna and positioned inside of the opening, wherein in a state that the IC card is inserted into the housing, the antenna terminal of the IC card is in contact with the antenna contact of the housing so that they are connected electrically, and the IC card functions as a noncontact IC card.

2. The IC card according to claim 1, wherein the antenna terminal is located between a group of terminals C1, C2, C3, C4 and a group of terminals C5, C6, C7, C8 as defined in ISO-7816.

3. The IC card according to claim 1, wherein the antenna terminal is located at a position of a RFU(Reversed For Future Use) terminal defined in ISO-7816.

4. The hybrid IC card housing according to claim 1, further comprising a contact to be connected electrically with the external connection terminal of the IC card, the housing being portable.

* * * * *